(12) United States Patent
Huang et al.

(10) Patent No.: US 9,627,539 B2
(45) Date of Patent: Apr. 18, 2017

(54) REPLACEMENT CHANNELS FOR SEMICONDUCTOR DEVICES AND METHODS FOR FORMING THE SAME USING DOPANT CONCENTRATION BOOST

(71) Applicant: TAIWAN SEMICONDUCTOR MANUFACTURING CO., LTD., Hsin-Chu (TW)

(72) Inventors: Yu-Lien Huang, Jhubei (TW); Ming-Huan Tsai, Zhubei (TW); Clement Hsingjen Wann, Carmel, NY (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/597,590

(22) Filed: Jan. 15, 2015

(65) Prior Publication Data
US 2015/0137266 A1 May 21, 2015

Related U.S. Application Data

(62) Division of application No. 13/628,359, filed on Sep. 27, 2012, now Pat. No. 8,946,035.

(51) Int. Cl.
*H01L 29/78* (2006.01)
*H01L 21/336* (2006.01)
(Continued)

(52) U.S. Cl.
CPC .. *H01L 29/7851* (2013.01); *H01L 21/823412* (2013.01); *H01L 21/823431* (2013.01); *H01L 29/105* (2013.01); *H01L 29/1054* (2013.01); *H01L 29/161* (2013.01); *H01L 29/167* (2013.01); *H01L 29/66477* (2013.01); *H01L 29/66545* (2013.01); *H01L 29/66651* (2013.01); *H01L 29/66628* (2013.01); *H01L 29/66636* (2013.01)

(58) Field of Classification Search
CPC .............. H01L 29/78; H01L 29/66477; H01L 29/66545; H01L 29/7851
USPC ........................................ 257/288, 412, 348
See application file for complete search history.

(56) References Cited

U.S. PATENT DOCUMENTS 7,057,216 B2  6/2006 Ouyang et al.
7,781,315 B2  8/2010 Lenoble
(Continued)

*Primary Examiner* — Long K Tran
*Assistant Examiner* — Thai T Vuong
(74) *Attorney, Agent, or Firm* — Duane Morris LLP

(57) ABSTRACT

A replacement channel and a method for forming the same in a semiconductor device are provided. A channel area is defined in a substrate which is a surface of a semiconductor wafer or a structure such as a fin formed over the wafer. Portions of the channel region are removed and are replaced with a replacement channel material formed by an epitaxial growth/deposition process to include a first dopant concentration level less than a first dopant concentration level. A subsequent doping operation or operations is then used to boost the average dopant concentration to a level greater than the first dopant concentration level. The replacement channel material is formed to include a gradient in which the upper portion of the replacement channel material has a greater dopant concentration than the lower portion of replacement channel material.

20 Claims, 4 Drawing Sheets

(51) Int. Cl.
  *H01L 21/8238* (2006.01)
  *H01L 27/088* (2006.01)
  *H01L 29/66* (2006.01)
  *H01L 29/10* (2006.01)
  *H01L 21/8234* (2006.01)
  *H01L 29/161* (2006.01)
  *H01L 29/167* (2006.01)

(56) References Cited

U.S. PATENT DOCUMENTS

| | | | |
|---|---|---|---|
| 8,420,459 B1 | 4/2013 | Cheng et al. | |
| 2006/0060887 A1 | 3/2006 | Geiss et al. | |
| 2007/0102790 A1 | 5/2007 | Todd | |
| 2008/0272409 A1* | 11/2008 | Sonkusale | H01L 29/1058 257/287 |
| 2009/0230463 A1* | 9/2009 | Carter | H01L 21/28114 257/327 |
| 2009/0294860 A1* | 12/2009 | Mowry | H01L 21/823807 257/368 |
| 2010/0047977 A1* | 2/2010 | Clifton | H01L 29/1054 438/218 |
| 2010/0276761 A1* | 11/2010 | Tung | H01L 29/41791 257/384 |
| 2011/0068369 A1* | 3/2011 | Cheng | H01L 21/823807 257/192 |
| 2011/0193178 A1* | 8/2011 | Chang | H01L 29/7853 257/408 |
| 2011/0215376 A1* | 9/2011 | Holt | H01L 29/78 257/192 |
| 2012/0286371 A1* | 11/2012 | Guo | H01L 29/66537 257/408 |
| 2013/0161706 A1 | 6/2013 | Ning et al. | |
| 2013/0178022 A1 | 7/2013 | Cheng et al. | |
| 2013/0178024 A1 | 7/2013 | Flachowsky et al. | |
| 2013/0200459 A1* | 8/2013 | Adam | H01L 29/66545 257/348 |
| 2013/0299906 A1 | 11/2013 | Cheng et al. | |
| 2014/0015021 A1 | 1/2014 | Chang et al. | |

* cited by examiner

REPLACEMENT CHANNELS FOR SEMICONDUCTOR DEVICES AND METHODS FOR FORMING THE SAME USING DOPANT CONCENTRATION BOOST

PRIORITY CLAIM AND CROSS-REFERENCE

This application is a divisional application of U.S. patent application Ser. No. 13/628,359, filed Sep. 27, 2012, which application is expressly incorporated by reference herein in its entirety.

TECHNICAL FIELD

The disclosure is related most generally to semiconductor devices and methods for forming the same and, more particularly, to replacement transistor channels formed using a dopant impurity boost after in-situ epitaxial deposition of channel material.

BACKGROUND

In the rapidly advancing semiconductor fabrication industry, there is a constant challenge to form devices with smaller feature sizes and which operate at faster speeds. Semiconductor devices operate using thousands or even millions of transistors such as MOSFET (Metal Oxide Semiconductor Field Effect Transistor) devices. The MOSFETs include NMOS transistors and PMOS transistors. These transistor devices utilize channels through which current flows when activated by the associated transistor gate. The current flows from the source to the drain of the transistor and the speed by which the current flows from the source to the drain is of paramount importance and is largely determined by the channel material. Replacement channels are often used when the transistor devices are formed on substrates formed of silicon or similar materials. With replacement channels, the silicon or other substrate material, is replaced with a different channel material that is a high mobility material which enables faster device speed than the silicon or other original channel material, prevents strain and is resistant to degradation. Epitaxial deposition methods are favored for producing replacement channels.

High dopant concentrations are advantageously utilized in many replacement channel materials to provide faster channel speeds. This is true for both P-type channels and N-type channels used in PMOS and NMOS transistors, respectively.

When replacement channel materials are formed using epitaxial deposition methods, however, it is difficult to achieve the high dopant concentration levels necessary to provide the increased device speed in a stable, reliable and defect-free material. This shortcoming can be attributed to the defects that are created when epitaxial deposition processes are used to produce replacement channel materials with high dopant concentrations. The defect density of the replacement channel material increases as does the dopant concentration level produced by the epitaxial deposition process used to form the replacement channel material.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

The word "exemplary," when used herein, means "serving as an example or illustration." Any aspect, feature or design of the disclosure described herein as "exemplary" is not necessarily to be construed as preferred or advantageous over other aspects, features or designs of the disclosure.

The disclosure provides for identifying or defining a channel region in a substrate. The substrate is a semiconductor wafer in some embodiments and the substrate is a semiconductor fin or other structure formed over a semiconductor or other wafer, in other embodiments. The channel region is defined using various methods in various embodiments. In some embodiments, a gate dielectric and a gate electrode are formed and patterned over the substrate, thus defining the channel region. The originally-formed gate dielectric and gate electrode function as dummy features and are removed to expose the channel region in some embodiments. In many embodiments, the dummy gate electrode and dummy gate dielectric are surrounded by an inter-level dielectric, ILD, such that their removal exposes the channel region. Other methods for defining and exposing the channel region are used in other embodiments.

Figure 1:
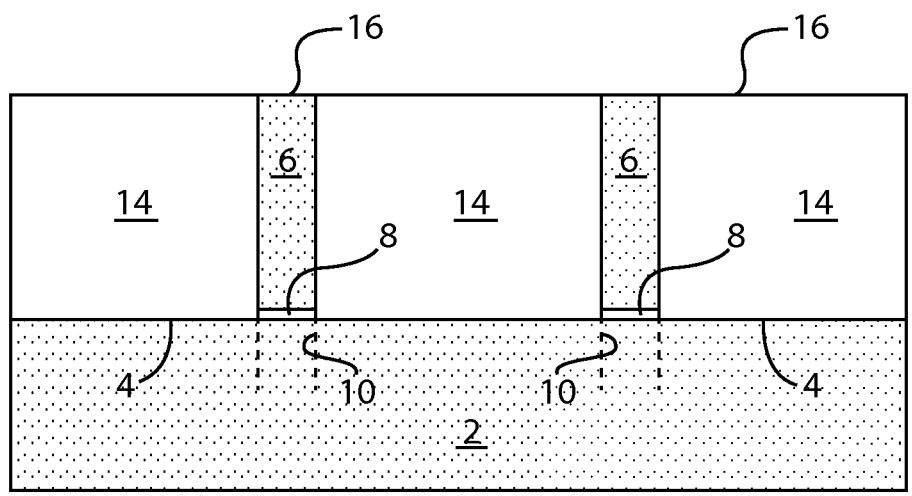
FIG. 1 is a cross-sectional view showing a channel region defined in a substrate.

Now turning to FIG. 1, dummy gate electrodes 6 and dummy gate dielectric 8 are formed over surface 4 of substrate 2. In some embodiments, substrate 2 is a bulk semiconductor substrate such as a semiconductor wafer, formed of silicon or other suitable substrate materials, and surface 4 is a planar substrate surface. In other embodiments, substrate 2 represents a cross-sectional view of a semiconductor fin such as used in FinFET technology to form FinFET semiconductor devices. According to the FinFET embodiment, dummy gate electrode 6 and dummy gate dielectric 8 are formed over a top surface of the fin such as over surface 4 in the cross-sectional view illustrated in FIG. 1, and dummy gate electrode 6 and dummy gate dielectric 8 also extend over front and back surfaces (not shown in FIG. 1) of substrate 2. According to the FinFET embodiment, substrate 2 is formed of silicon or other suitable semiconductor materials.

The following process description is largely described with respect to a planar transistor formed over a surface of a planar substrate such as a wafer, but it should be understood that the description also applies to the formation of FinFET semiconductor devices.

Still referring to FIG. 1, dummy gate 6 is formed of polysilicon in many embodiments, but is formed of other materials in other embodiments. Dummy gate dielectric 8 is formed of oxide or other dielectric materials. Dummy gate 6 and dummy gate dielectric 8 define channel region 10 in substrate 2. Dummy gate electrode 6 is disposed within and surrounded by interlevel dielectric, ILD 14. ILD 14 is formed of various suitable dielectric materials in various embodiments. Various methods and techniques are available and are used to pattern dummy gate electrode 6 and dummy gate dielectric 8 prior to the subsequent formation of interlevel dielectric, ILD 14. It should also be understood that prior to the deposition of ILD 14, other structures are formed in or on substrate 2 in various embodiments, but these structures are not shown in FIGS. 1-4, in order to more clearly describe aspects of the replacement channel methods and aspects of the disclosure. For example, source/drain regions are formed in substrate 2 adjacent dummy gate electrode 6 or adjacent spacers alongside dummy gate electrode 6 at the stage of processing shown in FIG. 1, in various embodiments. Such additional features are shown in FIGS. 5A and 5B.

Still referring to FIG. 1, planar surface 16 including portions of ILD 14 and dummy gate electrode 6, is formed by CMP, chemical mechanical polishing, or other suitable planarizing operations in other embodiments. The use of a planarization process to produce the structure shown in FIG. 1, simplifies the removal of dummy gate electrode 6 and dummy gate dielectric 8 to clearly expose channel region 10, but such is exemplary only and in other embodiments, other structures and other methods are used to define channel region 10.

Figure 2:
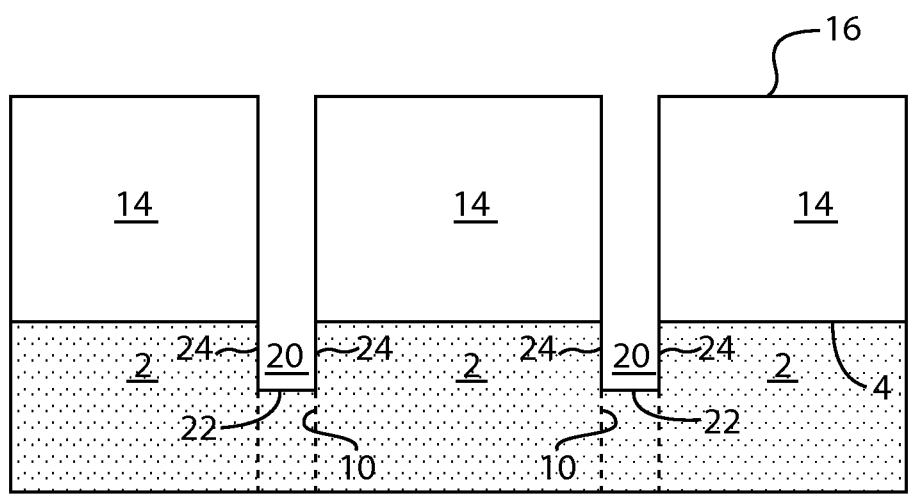
FIG. 2 is a cross-sectional view showing the removal of original channel material from a substrate.

FIG. 2 shows the structure of FIG. 1 after the removal of dummy gate electrode 6, dummy gate dielectric 8 and portions of channel region 10. Both dummy gate electrode 6 and dummy gate dielectric 8 are removed using various suitable selective removal processes, and many such processes are available to selectively remove these features to expose the channel region 10 portion of surface 4. With the channel region 10 portion of surface 4 exposed, portions of channel region 10 are then removed to produce void area 20. The portions of channel region 10 that are removed are the original channel materials which are part of substrate 2 which is Si or SiGe or other suitable substrate materials in various embodiments. Void area 20 includes bottom surface 22, which is planar and orthogonal to sidewalls 24 in the illustrated embodiment, but void area 20 has various other configurations in various other embodiments.

In some embodiments, channel materials of channel region 10 are removed to produce void area 20 using dry etching procedures such as but not limited to ICP, inductively coupled plasma, TCP, transformer coupled plasma, ECR, electron cyclotron resonance and RIE, reactive ion etching. Various other dry etching plasma based channel removal processes are used in other embodiments. According to the embodiment in which substrate 2 is silicon, gases such as F, Cl, and Br are used as etchant gases in some embodiments to remove channel materials, but other suitable etching gases are used in other embodiments. According to other embodiments, wet etching methods are used to remove channel material from channel region 10 and to form void area 20. According to embodiments in which wet etching is used, void area 20 is formed to include different configurations such as a V-shaped bottom surfaces or rounded bottom surfaces. Wet etching chemicals include $NH_4OH$, TMAH (tetra-methyl ammonium hydroxide), in various embodiments, but other suitable wet etchants are used in other embodiments. TMAH wet etching techniques have been found to produce V-shaped void areas 20 such as will be shown in FIG. 5B.

After void area 20 is formed, a replacement channel material with a gradient of dopant concentration and which is substantially defect-free, is formed using a multi-step operation including an epitaxial deposition method, a subsequent dopant impurity boost operation and an optional annealing operation. As such, the channel material re-formation process is a two or three step process in various embodiments.

Figure 3:
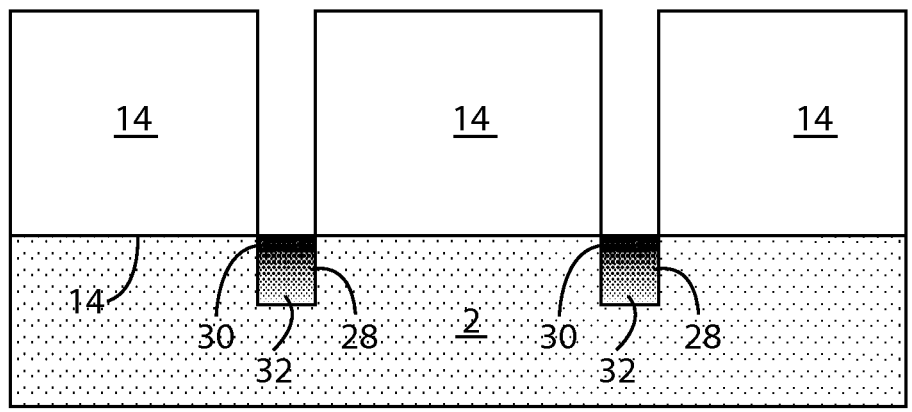
FIG. 3 is a cross-sectional view showing a replacement channel formed in a substrate according to an embodiment of the disclosure.

FIG. 3 shows replacement channel material 28 formed in former void 20 of FIG. 2. In one embodiment, replacement channel material 28 is formed using epitaxial formation processes. Epitaxial formation processes are referred to alternatively as epitaxial deposition processes and epitaxial growth processes and may be referred to interchangeably herein. Replacement channel material 28 is germanium, Ge, in one embodiment and replacement channel material 28 is silicon germanium, SiGe, in other embodiments. Various ratios of silicon and germanium are used. According to one SiGe embodiment, the channel material is represented by $SiGe_x$ in which x is equal to or greater than 10%. Still other suitable channel materials are used as replacement channel material 28 in other embodiments. Various epitaxial growth/deposition processes are used in various embodiments to selectively form replacement channel material 28. Dopants are included in the epitaxial growth/deposition process used to form replacement channel material 28 such that replacement channel material 28 is a doped material upon formation. According to one embodiment in which PMOS transistors are formed, the dopant material is boron although other P-type dopants are used in other embodiments. According to the embodiment in which the structure in FIG. 3 is used to form NMOS transistors, the dopant is phosphorus or other suitable N-type dopant impurities. Upon growth/deposition (i.e. formation) of replacement channel material 28, replacement channel material 28 includes a dopant concentration less than a first threshold average dopant concentration. In one embodiment, the first threshold average dopant concentration is $5E18$ atoms/cm$^3$ but in other embodiments, other first threshold average dopant concentrations are used. By forming the replacement channel material to include an overall/average dopant concentration less than or equal to the first threshold average dopant concentration upon formation, defects in replacement channel material 28 are avoided.

After the initial formation of channel material 28, a further doping process is carried out to boost the dopant concentration in replacement channel material 28. In one embodiment, the dopant species used in the dopant concentration boosting further doping process are the same species as the dopants in the epitaxial formation process, i.e. when a NMOS transistor is formed to include replacement channel material 28 including phosphorus as the dopant upon deposition, phosphorus is also introduced in the further doping process. In one embodiment, a beam line ion implantation process is carried out in which dopant precursor materials are ionized and then accelerated towards substrate 2 and implanted within replacement channel material 28. When beam line ion implantation processes are used for the further doping process, $BF_3$ is used as a boron precursor and $PH_3$ is used as a phosphorus precursor in various embodiments but other precursors are used in other embodiments. While the dopant species used in the concentration boosting further doping process are generally the same species as the dopants in the epitaxial formation process, different dopant species of the same or different dopant type, are added by the further doping process in other embodiments.

According to another embodiment, a plasma doping, PLAD, operation is used to introduce the dopants and boost the overall dopant impurity concentration, in the further doping step. Various conditions are used for the PLAD process. In one embodiment in which boron is the dopant introduced to replacement channel material 28, a boron PLAD process is used including a gas of 10% $B_2H_6$ and 90% $H_2$, a flow of about 120 sccm, a pressure of about 6 mt, a power of 725 watts and energy of 5 Kev to boost the concentration of boron in replacement channel material 28. Various other conditions are used in various other embodiments depending on the level of dopant boosting desired and the initial overall dopant concentration.

In various other embodiments in which PLAD is used, the PLAD process utilizes a temperature within the range of about 10-50° C., a pressure within the range of about 1-100 mTorr and RF power in a range of about 100 W to about 1000 W at a radio frequency of about 2 KHz to about 13.6 MHz but other conditions are used in other embodiments. In various boron embodiments, precursors of $H_2B_3$ or $BF_3$ are used and in one phosphorus embodiment, a precursor of $PH_3$ is used but other precursors are used for P-type dopants and N-type dopants in other embodiments.

According to one embodiment, the dopant boost in the further doping procedure raises the overall average dopant concentration of replacement channel material 28 from below the first threshold average dopant concentration to above the first threshold average dopant concentration. In one embodiment, the dopant boost raises the overall average dopant concentration of replacement channel material 28 from below about 5E18 atoms/cm$^3$ to above about 5E18 atoms/cm$^3$. In one embodiment, the dopant boost raises the overall average dopant concentration within the range of about 5E18 atoms/cm$^3$ to about 5E23 atoms/cm$^3$. In other embodiments, other pre and post dopant concentrations are used. For example, in one exemplary embodiment, the first threshold average dopant concentration of replacement channel material 28 is less than 7E17 atoms/cm$^3$ and is increased to a dopant concentration greater than 7E17 atoms/cm$^3$ after the further doping boost process.

According to some embodiments, an annealing operation is carried out subsequent to the further doping process. Annealing conditions include a temperature within a range of about 900° C. to about 1350° C. in various embodiments and the annealing process is an RTA, rapid thermal anneal, or a millisecond anneal process in various embodiments. In other embodiments, longer anneal times and correspondingly lower temperatures are used to carry out the annealing operation.

In addition to the increase in the overall average dopant concentration, the further doping process produces a gradient of dopant concentration within replacement channel material 28 in many embodiments. According to one embodiment, upper portion 30 of replacement channel material 28 includes a dopant concentration greater than 5E18 atoms/cm$^3$ and lower portion 32 includes a dopant concentration less than 5E18 atoms/cm$^3$. In one embodiment, the dopant concentration of upper portion 30 of replacement channel material 28 is in the range of about 5E18 to 5E23 atoms/cm$^3$ but other concentrations are used in other embodiments. According to other embodiments in which the first threshold average dopant concentration is a value other than 5E18 atoms/cm$^3$, the dopant concentration of upper portion 30 is greater than the first threshold average dopant concentration and the dopant concentration of lower portion 32 is less than the first threshold average dopant concentration. In some embodiments, the gradient includes a gradual change in doping concentration, i.e. a gradual decrease in dopant concentration from the top to the bottom of replacement channel material 28.

Figure 4:
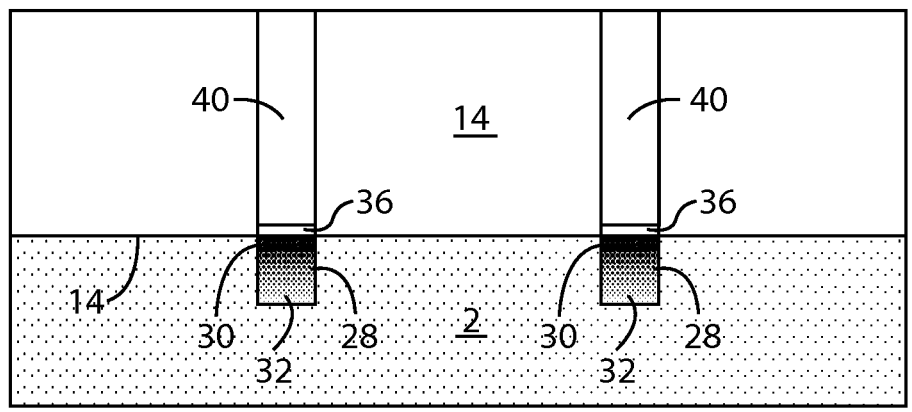
FIG. 4 is a cross-sectional view showing the embodiment of FIG. 3 with a gate electrode formed over the replacement channel.
Figure 5A:
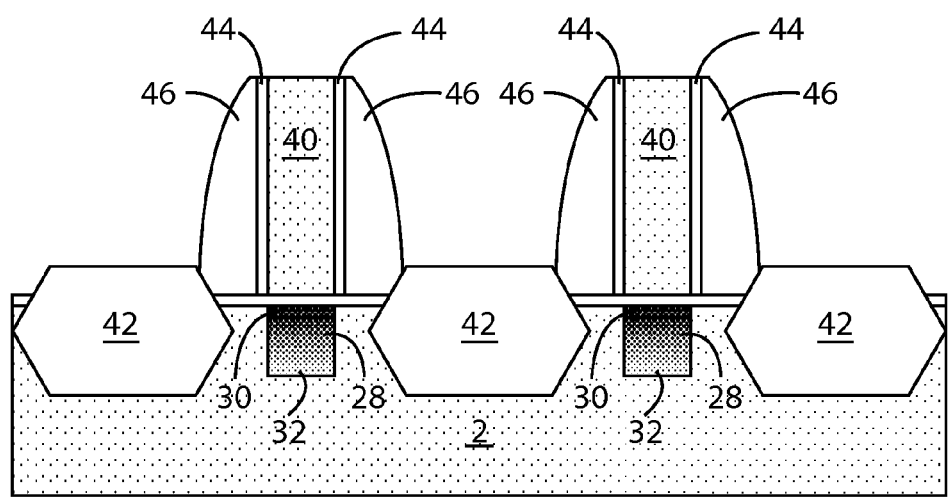
FIGS. 5A and 5B are cross-sectional views that show embodiments of transistors formed with replacement channels according to the disclosure.
Figure 5B:
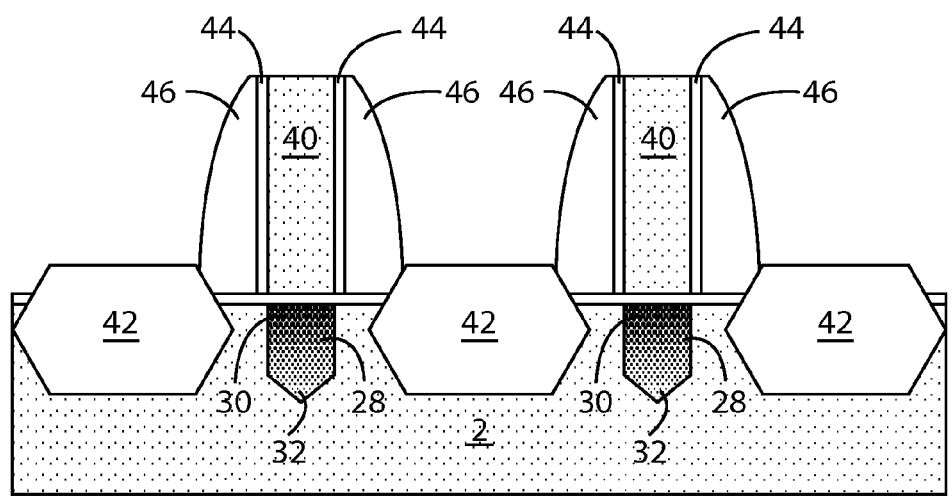

After replacement channel material 28 is formed to include a dopant gradient, a replacement gate dielectric and replacement gate are formed such as shown in FIG. 4. Replacement gate dielectric 36 is formed over replacement channel material 28. In various embodiments, replacement gate dielectric 36 is a high-k gate dielectric but other suitable gate dielectrics are used in other embodiments. In some embodiments, replacement gate dielectric 36 is formed over a further gate dielectric growth over replacement channel material 28. Replacement gate electrode 40 is formed over replacement gate dielectric 36. Replacement gate electrode 40 is a metal gate in various embodiments but other materials are used in other embodiments. Various methods such as CMP are used to form replacement gate electrode 40 illustrated in FIG. 4. After replacement gate electrode 40 is formed, ILD 14 is removed and further processing operations are carried out to form and interconnect the transistors utilizing replacement channel material 28, replacement gate dielectric 36 and replacement gate electrode 40.

FIGS. 5A and 5B show two embodiments of transistors formed in accordance with the disclosure. The structures in FIGS. 5A and 5B are essentially the same with the exception that replacement channel material 28 has a rectangular shape with an essentially flat bottom in FIG. 5A and has a V-shaped bottom in FIG. 5B. The V-shaped bottom of FIG. 5B is formed by wet etching in some embodiments. The shape of replacement channel material 28 is determined by the shape of void 20 and it should be understood that void 20 is formed to various other configurations in various embodiments. Now referring to both FIGS. 5A and 5B, source/drain regions 42 are formed in substrate 2 adjacent the structure including replacement gate electrode 40, inner spacers 44 and outer spacers 46. Various suitable materials and formation methods are used for inner spacers 44 and outer spacers 46. As previously indicated, source/drain regions 42 are formed in conjunction with dummy gate electrode 6 and prior to the formation of replacement channel material 28 and replacement gate electrode 40, in some embodiments. In each of FIGS. 5A and 5B, replacement channel material 28 includes the dopant gradient discussed previously including upper portion 30 and lower portion 32 but it should be understood that there is a gradual gradient of dopant concentration within replacement channel material 28 whereby the dopant concentration decreases along the direction from top to bottom of replacement channel material 28.

Figure 6:
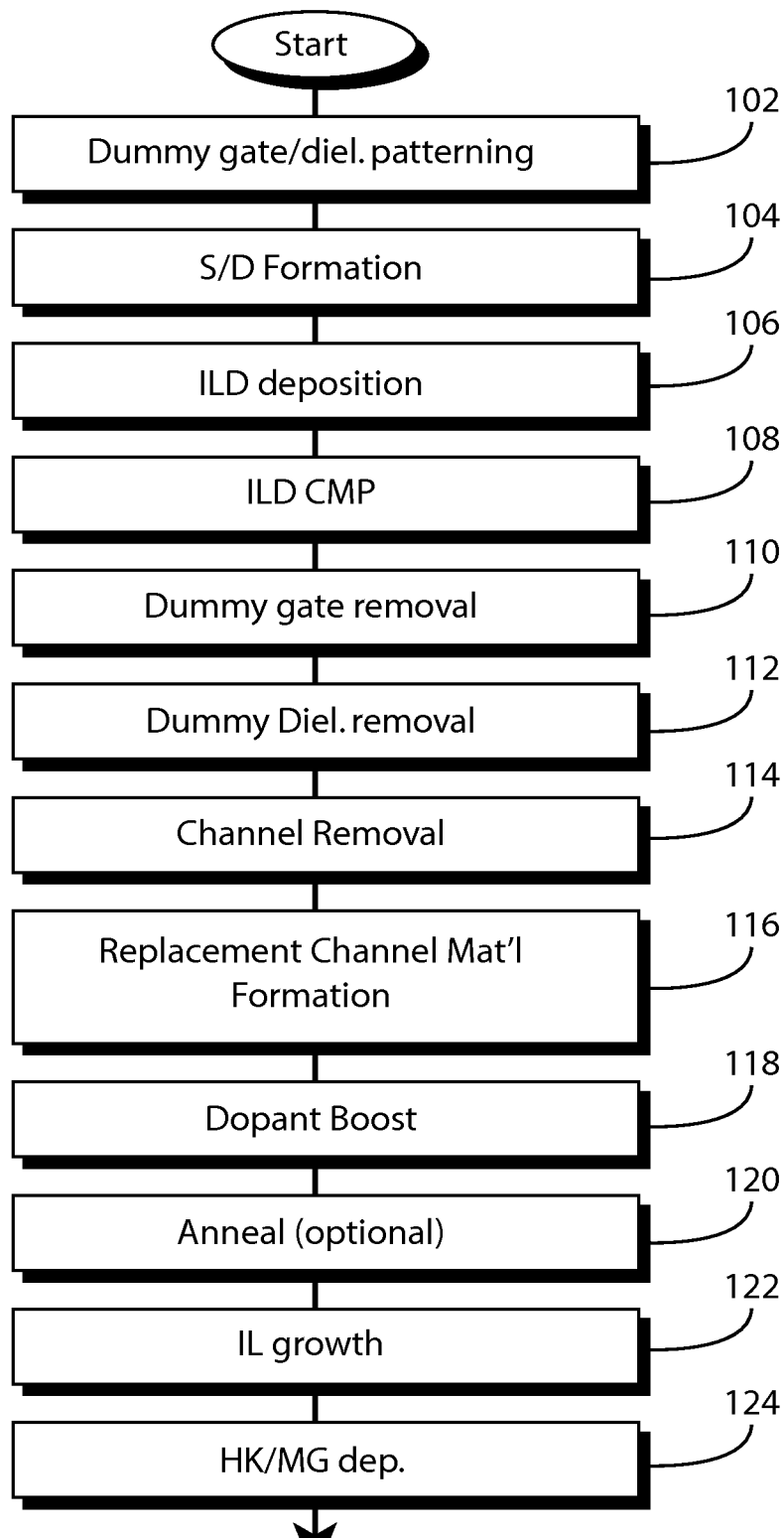
FIG. 6 is a flow chart of a method for forming a replacement channel according to the disclosure.

FIG. 6 is a flowchart that generally outlines the processing operations described above. At step 102, the dummy gate electrode and dummy gate oxide or other dielectric are patterned such as to produce dummy gate electrode 6 and dummy gate dielectric 8 such as shown in FIG. 1. Source/drain formation takes place at step 104 prior to ILD deposition although the source/drain structures are not shown in FIG. 1. At step 106, the deposition of ILD 14 takes place and at step 108 chemical mechanical polishing, CMP, or other suitable planarization operations are used to planarize the structure such as to form a planar surface such as the planar surface 16 shown in FIG. 1. The dummy gate electrode is removed at step 110 and the dummy gate dielectric is removed at step 112. Portions of the channel material are removed at channel removal step 114 to essentially produce the structure shown in FIG. 2. At step 116, the replacement channel material is formed and at dopant boost step 118, the further doping operation is used to boost the dopant concentration within the replacement channel material. An optional annealing operation is performed in some embodiments at step 120. After the replacement channel deposition operation of step 116, the dopant boost operation of 118 and the optional annealing operation of 120 are carried out, the replacement channel material with the gradient of dopant concentration such as illustrated in FIG. 3, is formed. At step 122, ("IL growth") gate dielectric deposition operations are carried out and at step 124, the high-k replacement gate deposition operations are carried out such as to form the structure shown in FIG. 4.

According to one aspect, provided is a method for forming a semiconductor transistor. The method comprises: defining a channel region in a semiconductor substrate, the channel region associated with a transistor; removing channel material from the channel region thereby forming a void in the semiconductor substrate in the channel region; forming replacement channel material within the void, the replacement channel material comprising one of Ge and SiGe, and including a dopant, and having an as-deposited average dopant concentration less than a first dopant concentration; and further doping the replacement channel material with the dopant thereby increasing the average dopant concentration to greater than the first dopant concentration.

According to another aspect, provided is a method for forming a FinFET semiconductor device. The method comprises: forming a fin over a substrate, at least a portion of the fin comprising a channel region and the fin formed of a semiconductor material; removing channel material from the channel region thereby forming a void in the fin in the channel region; forming replacement channel material within the void, the replacement channel material comprising one of Ge and SiGe, and including a dopant, and having an as deposited overall dopant concentration of less than 5E18 atoms/cm$^3$. The method further comprises further doping the replacement channel material with the dopant thereby increasing the surface or overall dopant concentration to greater than 5E18 atoms/cm$^3$.

According to another aspect, provided is a semiconductor transistor device comprising: a substrate and a channel comprising a channel material formed in an opening in the substrate. The channel material comprises one of Ge and SiGe, doped with a dopant material. The channel material includes a dopant gradient in which an upper portion of the channel material has a higher dopant concentration than a lower portion of the channel material. A transistor gate is formed over the channel material; and source/drain materials are formed in source/drain openings in the substrate and adjacent the channel.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A semiconductor transistor device comprising:
   a substrate;
   a channel entirely contained within a layer of a single channel material disposed in an opening in the substrate, the channel material having a single base material, the base material comprising Ge or SiGe, and a dopant material with a dopant gradient having a continuous decrease in dopant concentration from a first dopant concentration on an upper surface of the channel to a second dopant concentration on a lower surface of the channel; and
   a transistor gate disposed over the channel material.

2. The semiconductor transistor device of claim 1, further comprising source/drain regions disposed in respective openings in the substrate and adjacent to the channel.

3. The semiconductor transistor device of claim 1, further comprising a gate oxide between the channel and the transistor gate.

4. The semiconductor transistor device of claim 3, wherein the gate oxide is a high-k gate dielectric.

5. The semiconductor transistor device of claim 1, wherein the substrate comprises a silicon wafer.

6. The semiconductor transistor device of claim 1, wherein the transistor gate is a metal gate.

7. The semiconductor transistor device of claim 1, wherein the channel material comprises SiGe$_x$, where x is equal to or greater than 10%.

8. The semiconductor transistor device of claim 1, wherein the channel has a substantially round bottom surface.

9. The semiconductor transistor device of claim 1, wherein the channel has a substantially V-shaped bottom.

10. The semiconductor transistor device of claim 1, wherein the first dopant concentration on the upper surface of the channel is greater than 5E18 atoms/cm$^3$ and the second dopant concentration of the lower surface of the channel is less than 5E18 atoms/cm$^3$.

11. The semiconductor transistor device of claim 1, wherein the semiconductor transistor is a PMOS transistor and the dopant material comprises boron.

12. The semiconductor transistor device of claim 1, wherein the semiconductor transistor comprises an NMOS transistor and the dopant comprises phosphorus.

13. The semiconductor transistor device of claim 1, wherein the semiconductor transistor device comprises a FinFET (fin field-effect transistor) and the substrate comprises a semiconductor fin.

14. The semiconductor transistor device of claim 1, wherein the first dopant concentration on the upper surface of the channel is about 5E18 atoms/cm$^3$ and the second dopant concentration on the lower surface of the channel is about 5E23 atoms/cm$^3$.

15. A semiconductor transistor device comprising:
a substrate comprising silicon;
a channel entirely contained within a layer a single channel material disposed in an opening in the substrate, the channel material having a single base material, the base material comprising Ge or SiGe, and a dopant material with a dopant gradient including a continuous decrease in dopant concentration from a first dopant concentration on a top surface of the channel to a second dopant concentration on a bottom surface of the channel;
a transistor gate disposed over the channel material, the transistor gate being a metal gate;
a gate oxide between the channel and the transistor gate, the gate oxide being a high-k gate dielectric; and
source/drain regions disposed in respective openings in the substrate and adjacent to the channel.

16. The semiconductor transistor device of claim 15, wherein the first dopant concentration on the upper surface of the channel is greater than 5E18 atoms/cm$^3$ and the second dopant concentration on the lower surface of the channel is less than 5E18 atoms/cm$^3$.

17. The semiconductor transistor device of claim 15, wherein the semiconductor transistor is a PMOS transistor and the dopant material comprises boron.

18. The semiconductor transistor device of claim 15, wherein the semiconductor transistor comprises an NMOS transistor and the dopant comprises phosphorus.

19. A FinFET semiconductor transistor device comprising:
a substrate;
a channel entirely contained within a layer of a single channel material disposed in an opening in the substrate, the channel material having a single base material, the base material comprising Ge or SiGe, and a dopant material with a dopant gradient including a continuous decrease in dopant concentration from a first dopant concentration on a top surface of the channel to a bottom surface of the channel;
a transistor gate disposed over the channel material;
a gate oxide between the channel and the transistor gate; and
source/drain regions disposed in respective openings in the substrate and adjacent to the channel.

20. The semiconductor transistor device of claim 19, wherein the substrate comprising a silicon wafer; the transistor gate is a metal gate; the gate oxide is a high-k gate dielectric, and the dopant material comprises boron or phosphorous.

* * * * *